United States Patent
Greene et al.

(10) Patent No.: US 9,105,722 B2
(45) Date of Patent: Aug. 11, 2015

(54) TUCKED ACTIVE REGION WITHOUT DUMMY POLY FOR PERFORMANCE BOOST AND VARIATION REDUCTION

(71) Applicant: INTERNATIONAL BUSINESS MACHINES CORPORATION, Armonk, NY (US)

(72) Inventors: Brian J. Greene, Wappingers Falls, NY (US); Yue Liang, Sunnyvale, CA (US); Xiaojun Yu, Sunnyvale, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/486,108

(22) Filed: Sep. 15, 2014

(65) Prior Publication Data

US 2015/0001585 A1   Jan. 1, 2015

Related U.S. Application Data

(62) Division of application No. 13/253,375, filed on Oct. 5, 2011, now Pat. No. 8,853,035.

(51) Int. Cl.
| | |
|---|---|
| *H01L 29/76* | (2006.01) |
| *H01L 29/78* | (2006.01) |
| *H01L 21/28* | (2006.01) |
| *H01L 29/66* | (2006.01) |
| *H01L 29/165* | (2006.01) |
| *H01L 21/02* | (2006.01) |
| *H01L 21/762* | (2006.01) |
| *H01L 29/06* | (2006.01) |

(52) U.S. Cl.
CPC ...... *H01L 29/7848* (2013.01); *H01L 21/02112* (2013.01); *H01L 21/02532* (2013.01); *H01L 21/28123* (2013.01); *H01L 21/76224* (2013.01); *H01L 29/0649* (2013.01); *H01L 29/165* (2013.01); *H01L 29/66545* (2013.01); *H01L 29/66553* (2013.01); *H01L 29/66568* (2013.01); *H01L 29/66636* (2013.01)

(58) Field of Classification Search
USPC ......... 257/288, 296, 300, 314, 344, 368, 379, 257/401; 438/285, 199
See application file for complete search history.

(56) References Cited

U.S. PATENT DOCUMENTS

| | | |
|---|---|---|
| 6,686,231 B1 | 2/2004 | Ahmed et al. |
| 6,855,582 B1 | 2/2005 | Dakshina-Murthy et al. |
| 6,864,164 B1 | 3/2005 | Dakshina-Murthy et al. |
| 7,026,203 B2 | 4/2006 | Lee |
| 7,041,542 B2 | 5/2006 | Ahmed et al. |
| 7,084,018 B1 | 8/2006 | Ahmed et al. |
| 7,256,455 B2 | 8/2007 | Ahmed et al. |

(Continued)

*Primary Examiner* — Errol Fernandes
(74) *Attorney, Agent, or Firm* — Scully, Scott, Murphy & Presser, P.C.; H. Daniel Schnurmann (57) ABSTRACT

In one embodiment, a semiconductor device is provided that includes a semiconductor substrate including an active region and at least one trench isolation region at a perimeter of the active region, and a functional gate structure present on a portion of the active region of the semiconductor substrate. Embedded semiconductor regions are present in the active region of the semiconductor substrate on opposing sides of the portion of the active region that the functional gate structure is present on. A portion of the active region of the semiconductor substrate separates the outermost edge of the embedded semiconductor regions from the at least one isolation region. Methods of forming the aforementioned device are also provided.

14 Claims, 5 Drawing Sheets

(56) References Cited

U.S. PATENT DOCUMENTS

| | | |
|---|---|---|
| 7,504,301 B2 | 3/2009 | Waite et al. |
| 7,626,246 B2 | 12/2009 | Lochtefeld et al. |
| 7,642,197 B2 | 1/2010 | Chidambaram et al. |
| 7,648,867 B2 | 1/2010 | Watanabe et al. |
| 7,687,338 B2 | 3/2010 | Jain et al. |
| 7,687,357 B2 | 3/2010 | Kim et al. |
| 7,786,518 B2 | 8/2010 | Chakravarthi et al. |
| 7,871,915 B2 | 1/2011 | Lim et al. |
| 8,350,253 B1 | 1/2013 | Zhu et al. |
| 2008/0119025 A1 | 5/2008 | Kwon et al. |
| 2008/0179650 A1 | 7/2008 | Kawakita |
| 2009/0315116 A1* | 12/2009 | Sakuma ................ 257/368 |
| 2012/0091539 A1 | 4/2012 | Fan et al. |
| 2013/0015524 A1 | 1/2013 | Hsu et al. |

* cited by examiner

TUCKED ACTIVE REGION WITHOUT DUMMY POLY FOR PERFORMANCE BOOST AND VARIATION REDUCTION

BACKGROUND

The present disclosure relates to semiconductor structures and methods of fabricating such semiconductor structures. More particularly, the present disclosure relates to semiconductor structures that include embedded semiconductor regions.

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

SUMMARY

A method of forming a semiconductor device is provided that includes providing a semiconductor substrate including an active region and at least one trench isolation region at a perimeter of the active region. A plurality of replacement gate structures are formed on the active region of the semiconductor substrate, wherein an interface replacement gate structure of the plurality of replacement gate structures is formed on an interface between the active region and the at least one trench isolation region, and at least one device replacement gate structure of the plurality of replacement gate structures is formed on a portion of the active region that is separated from the at least one trench isolation region. Embedded semiconductor regions are formed in the active region of the semiconductor substrate between adjacent replacement gate structures of the plurality of replacement gate structures. The device replacement gate structure is replaced with a functional gate structure. At least a portion of the interface replacement gate structure is removed.

A method of forming a semiconductor device is provided that includes providing a semiconductor substrate including an active region and at least one trench isolation region at a perimeter of the active region. At least one functional gate structure is formed on the active region of the semiconductor substrate and an interface replacement gate structure is formed on an interface between the active region and the at least one trench isolation region. The interface replacement gate structure includes a gate stack of a sacrificial gate conductor structure and a gate dielectric, and spacers adjacent to the gate stack. Embedded semiconductor regions are formed in the active region of the semiconductor substrate between the portion of the active region that the functional gate structure is present on and the portion of the active region at the interface with the at least one trench isolation region that the replacement gate structure is present on. Source regions and drain regions are formed on opposing sides of the portion of the substrate that the device gate structure is formed on. At least the sacrificial gate conductor structure of the interface replacement gate structure is removed.

In another aspect, a semiconductor device is provided. In one embodiment, the semiconductor device includes a semiconductor substrate including an active region and at least one trench isolation region at a perimeter of the active region. A functional gate structure is present on a portion of the active region of the semiconductor substrate. Embedded semiconductor regions are present in the active region of the semiconductor substrate on opposing sides of the portion of the active region that the functional gate structure is present on, wherein a portion of the active region of the semiconductor substrate separates the outermost edge of the embedded semiconductor regions from the at least one isolation region.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Detailed embodiments of the present disclosure are described herein; however, it is to be understood that the disclosed embodiments are merely illustrative of the present disclosure that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on", "present on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

Semiconductor device performance enhancements, such as increased charge carrier speed, may be provided by introducing a stress, e.g., tensile or compressive stress, to the channel region of the semiconductor device, e.g., n-type or p-type field effect transistor (FET). The stress may be induced to the channel region of a FET by positioning a well trench composed of a stress inducing material, i.e., embedded semiconductor region, adjacent to the channel region of the FET. It has been determined that contact by the embedded semiconductor region to the isolation region results in faceting of the material within the embedded semiconductor region. Faceting within the embedded semiconductor region may result in device variation, because of a stress loss as well as doping depth change. In one embodiment, the methods and structures disclosed herein reduce or substantially eliminate faceting of the embedded semiconductor region, by forming a replacement gate structure over the interface between the active region of the semiconductor substrate and the isolation region, e.g., trench isolation region, prior to forming the embedded semiconductor region. By forming the replacement gate structure over the interface between the active region and the trench isolation region, the subsequently formed embedded semiconductor region is separated from the trench isolation region, which reduces or substantially eliminates faceting in the embedded semiconductor region.

As used herein, a "semiconductor device" is an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. The doping of the source and drain regions of the semiconductor device dictate the conductivity type of the semiconductor device. As used herein, the term "conductivity type" denotes a semiconductor device having a p-type or n-type conductivity. In one embodiment, the semiconductor device that is provided by the present disclosure is a field effect transistor. A field effect transistor is a semiconductor device in which output current, i.e., source-drain current, is controlled by the voltage applied to a gate structure. A field effect transistor has three terminals, i.e., a functional gate structure, a source region and a drain region. The functional gate structure controls output current, i.e., flow of carriers in the channel, of a semiconducting device, such as a field effect transistor, through electrical or magnetic fields. The channel is the region between the source region and the drain region of a semiconductor device that becomes conductive when the semiconductor device is turned on. A p-type conductivity semiconductor device, such as a pFET, is a semiconductor device in which the source and drain regions of the device are doped with a p-type dopant. An n-type conductivity semiconductor device, such as an nFET, is a semiconductor device in which the source and drain regions of the device are doped with an n-type dopant.

Figure 1:
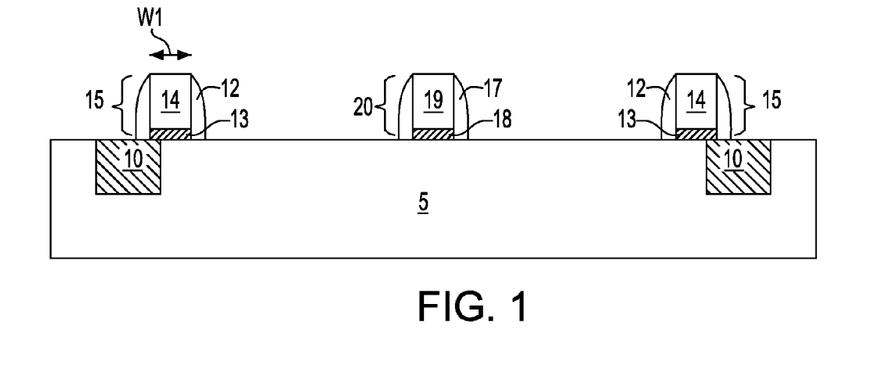
FIG. 1 is a side cross-sectional view of forming a plurality of replacement gate structures on a semiconductor substrate including an active region and at least one trench isolation region at a perimeter of the active region, in accordance with one embodiment of the present disclosure.

FIG. 1 depicts forming a plurality of replacement gate structures on a semiconductor substrate including an active region and at least one trench isolation region at a perimeter of the active region. The semiconductor substrate 5 may be composed of a Si-containing material. The term "Si-containing" is used herein to denote a material that includes silicon. Illustrative examples of Si-containing materials include, but are not limited to: Si, SiGe, SiGeC, SiC, polysilicon, i.e., polySi, epitaxial silicon, i.e., epi-Si, amorphous Si, i.e., α:Si, and multi-layers thereof. Although silicon is the predominantly used semiconductor material in wafer fabrication, alternative semiconductor materials can be employed, such as, but not limited to, germanium, gallium arsenide, gallium nitride, cadmium telluride and zinc sellenide. Although the semiconductor substrate 5 is depicted as a bulk-Si substrate, semiconductor on insulator (SOI) substrates have also been contemplated and are within the scope of the present disclosure.

An active region is located within the semiconductor substrate 5 and has a perimeter defined by an isolation region, such as a trench isolation region 10. In one example, in which the semiconductor device formed on the semiconductor substrate 5 is an n-type field effect transistor (nFET), the active region is doped to a p-type conductivity. In one example, in which the semiconductor device formed on the semiconductor substrate 5 is a p-type field effect transistor (nFET), the active region is doped to an n-type conductivity.

The isolation regions, e.g., trench isolation region 10, may comprise any of several dielectric isolation materials. Non-limiting examples include oxides, nitrides and oxynitrides, particularly of silicon, but oxides, nitrides and oxynitrides of other elements are not excluded. In one embodiment, the trench isolation region 10 primarily comprises an oxide of silicon. In one embodiment, the trench isolation region 10 is formed by forming a trench in the semiconductor substrate 5 utilizing a dry etching process, such as reactive-ion etching (RIE) or plasma etching, and then filling the trench with an insulating material, such as an oxide. In one embodiment, the trench may be filled using a deposition method, such as chemical vapor deposition (CVD).

FIG. 1 further depicts forming a plurality of replacement gate structures 15, 20 on a portion of a semiconductor substrate 5. At least one replacement gate structure 15 may be formed over the interface between the active region of the semiconductor substrate 5 and the trench isolation region 10, and is hereafter referred to as an "interface replacement gate structure" (identified by reference number 15). At least one of the replacement gate structure 20 is present over a portion of the active region that is subsequently processed to provide a semiconductor device, and is hereafter referred to as a "device replacement gate structure" (identified by reference number 20). The device replacement gate structure 20 includes a sacrificial material that defines the geometry of later formed functional gate structures that function to switch the semiconductor device from an "on" to "off" state, and vice versa. Each of the replacement gate structures 15, 20 may be composed of a sacrificial gate conductor structure 14, 19, a gate dielectric 13, 18, and a spacer 12, 17.

The gate dielectric 13, 18 may be formed in direct contact with the upper surface of the active region of the semiconductor substrate 5. The gate dielectric 13, 18 may be composed of any dielectric material, such as an oxide, nitride or oxynitride dielectric. In one embodiment, the gate dielectric 13, 18 may be composed of a high-k material. The term "high-k" denotes a material having a dielectric constant that is greater than the dielectric constant of silicon oxide at room temperature (20° C. to 25° C.), and atmospheric pressure (1 atm). For example, in one embodiment, the dielectric constant of the gate dielectric 13, 18 is greater than 4.0. In another embodiment, the high-k gate dielectric is comprised of a material having a dielectric constant greater than 10.0. In yet another embodiment, the high-k gate dielectric layer is comprised of a material having a dielectric constant ranging from 10 to 30.

Some examples of high-k dielectric materials suitable for the gate dielectric 13, 18 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the gate dielectric 13, 18 is hafnium oxide ($HfO_2$).

In one embodiment, the gate dielectric 13, 18 is formed using a deposition process, such as chemical vapor deposition (CVD). Chemical vapor deposition (CVD) is a deposition process in which a deposited species is formed as a result of chemical reaction between gaseous reactants at an elevated temperature (typically being greater than 200° C.), wherein solid product of the reaction is deposited on the surface on which a film, coating, or layer of the solid product is to be formed. Variations of chemical vapor deposition (CVD) processes for depositing the gate dielectric 13, 18 include, but are not limited to, Atmospheric Pressure CVD (APCVD), Low Pressure CVD (LPCVD) and Plasma Enhanced CVD (PECVD), Metal-Organic CVD (MOCVD) and others. In another embodiment, the gate dielectric 13, 18 may be formed by a thermal growth process such as, for example, oxidation, nitridation or oxynitridation. The gate dielectric 13, 18 has a thickness that ranges from 0.5 nm to 10 nm. In another embodiment, the gate dielectric 13, 18 has a thickness that ranges from 1 nm to 5 nm.

In one embodiment, when the gate dielectric 13, 18 is composed of a high-k dielectric, such as a Hf-containing dielectric, prior to forming the gate dielectric 13, 18, an interfacial dielectric layer (not shown) can be formed on the exposed portion of the semiconductor substrate 5. The interfacial dielectric layer can be provided by thermal oxidation. In one embodiment, thermal oxidation of silicon can be performed in the presence of oxygen at a temperature between 800° C. and 1200° C. In some examples, the oxidant may be either water vapor (steam) or molecular oxygen. In another embodiment, the interfacial dielectric layer is an oxide that is formed using deposition. In some embodiments, the interfacial dielectric layer is composed of silicon oxide and has a thickness that ranges from 1 nm to 5 nm.

In one embodiment, the sacrificial gate conductor structure 14, 19 may be composed of a semiconductor-containing material, such as a silicon-containing material. Silicon-containing materials that are suitable for the sacrificial gate conductor structure 14, 19 include, but are not limited to, silicon (Si), single crystal silicon, polycrystalline silicon, amorphous silicon, $SiO_2$, $Si_3N_4$, $SiO_xN_y$, SiC, SiCO, SiCOH, and SiCH compounds, and the above-mentioned silicon-containing materials with some or all of the Si replaced by Ge. In one example, the sacrificial material that provides the sacrificial gate conductor structure 14, 19 is amorphous silicon.

The sacrificial material layer that provides the sacrificial gate conductor structure 14, 19 may be formed on the gate dielectric 13, 18 using a deposition process, such as chemical vapor deposition (CVD). Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The sacrificial gate conductor structure 14, 19 may also be deposited using evaporation, chemical solution deposition, spin on deposition, and physical vapor deposition (PVD) methods.

In some embodiments, the material layers for the gate dielectric 13, 18 and the sacrificial gate conductor structure 14, 19 may be deposited using blanket deposited to form layered structure. Following deposition, the material layers for the gate dielectric 13, 18 and the sacrificial gate conductor structure 14, 19 may be patterned and etched to provide the replacement gate stack. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected, while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied. In some examples, the selectivity may be greater than 100:1.

In one embodiment, the etch process removes the exposed portions of the sacrificial material layer with an etch chemistry that is selective to the semiconductor substrate 5. In one embodiment, the etch process that forms the replacement gate structures is an anisotropic etch. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. The width W1 of each of the replacement gate stack may range from 20 nm to 250 nm. In another embodiment, the width W1 of each of the replacement gate stacks may range from 50 nm to 150 nm. In yet another embodiment, the width W1 of the each of the replacement gate stacks may range from 80 nm to 100 nm.

Still referring to FIG. 1, a spacer 12, 17 may be formed abutting the sidewall surfaces of the replacement gate stack. In some embodiments, each of the replacement gate structures 15, include a gate dielectric 13, 18, a sacrificial gate conductor structure 14, 19, and a spacer 12, 17. In some embodiments, the spacer 12, 17 may be omitted, so that the replacement gate structures 15, 20 include only the gate dielectric 13, 18, and the sacrificial gate conductor structure 14, 19. The spacer 12, 17 may be composed of an oxide, nitride or oxynitride. In one example, the spacer 12, 17 may be composed of silicon oxide ($SiO_2$). In yet another embodiment, the spacer 12, 17 may be composed of silicon nitride ($Si_3N_4$). Other examples of materials suitable for the spacer 12, 17 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. The spacer 12, 17 may be formed by deposition and etching.

Figure 2:
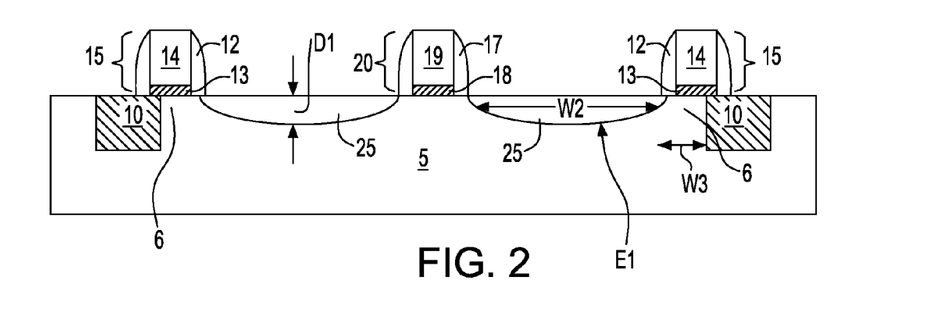
FIG. 2 is a side cross-sectional view of forming embedded semiconductor regions in the active region of the semiconductor substrate between adjacent replacement gate structures of the plurality of replacement gate structures, in accordance with one embodiment of the present disclosure.

FIG. 2 depicts forming embedded semiconductor regions 25 in the active region of the semiconductor substrate 5 between adjacent replacement gate structures 15, 20. The embedded semiconductor regions 25 may be formed by etching a trench into the active region of the semiconductor substrate 5. Because the interface replacement gate structure 15 is present over a portion of the active region of the semiconductor substrate 5 that is in contact with the trench isolation region 10, and the trench is formed using an anisotropic etch, the embedded semiconductor regions 25 have an outermost edge E1 that is separated from the trench isolation region 10 by a remaining portion 6 of the active region of the semiconductor substrate 5. The remaining portion 6 of the active region of the semiconductor substrate 5 is the portion of the semiconductor substrate 5 that is protected by the interface replacement gate structure 15 during the etch process that forms the trench for the embedded semiconductor regions 25.

FIG. 2 depicts some embodiments of etching well trenches into the active region of the semiconductor substrate 5 on opposing sides of the device replacement gate structure 20. The etch process for forming the well trenches may be an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present disclosure include ion beam etching, plasma etching or laser ablation.

The well trenches may have a width W2 ranging from 40 nm to 200 nm. In another embodiment, the well trenches have a width W2 ranging from 50 nm to 100 mm. The depth D1 of the well trenches may range from 5 nm to 50 nm. In another embodiment, the depth of the well trenches may range from 15 nm to 30 nm. The remaining portion 6 of the active region that separates the well trenches from the trench isolation regions 10 may have a width W3 that ranges from 5 nm to 50 nm. In another embodiment, the remaining portion 6 of the active region that separates the well trenches from the trench isolation regions 10 may have a width W3 that ranges from 10 nm to 30 nm.

Still referring to FIG. 2, the embedded semiconductor regions 25 may then be formed in the well trenches. By "embedded" it is meant that at least a portion of the embedded semiconductor region 25 is present below the upper surface of the semiconductor substrate 5. In some embodiments, greater than 75% of the embedded semiconductor region 25 is present below the upper surface of the semiconductor substrate 5. In yet another embodiment, greater than 90% of the embedded semiconductor region 25 is present below the upper surface of the semiconductor substrate 5. In one example, the entirety of the embedded semiconductor region 25 is present below the upper surface of the semiconductor substrate 5.

In one embodiment, the embedded semiconductor regions 25 may be epitaxially formed in the well trenches. "Epitaxially growing, epitaxial growth and/or deposition" mean the growth of a semiconductor material on a deposition surface of a semiconductor material, in which the semiconductor material being grown has the same crystalline characteristics as the semiconductor material of the deposition surface. When the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, possibly the result of implanting, the depositing atoms have no surface to align to, resulting in the formation of polysilicon instead of single crystal silicon.

In one embodiment, the epitaxially formed embedded semiconductor regions 25 are stress inducing materials. In some embodiments, the stress inducing materials that are present in the embedded semiconductor regions 25 induce a stress on the channel portion of the semiconductor device that increases carrier mobility, and therefore increase the switching speed of the device. In some embodiments, the stress on the channel of the semiconductor device induced by the embedded semiconductor regions 25 has a magnitude ranging from 100 MPa to 1000 MPa. In another example, the stress on the channel of the semiconductor device induced by the embedded semiconductor regions 25 has a magnitude ranging from 800 MPa to 1000 MPa.

The stress inducing material that is epitaxially grown in the well trenches may be a compressive stress inducing material or a tensile stress inducing material. The term "compressive stress inducing material" denotes a material having an intrinsic compressive stress, in which the intrinsic compressive stress produces a compressive stress in an adjacent material. In one embodiment, the compressive stress inducing material comprises silicon germanium (SiGe) that is grown atop silicon (Si). Increasing the germanium content increases the lattice dimension of the silicon germanium and therefore increases the compressive stress that is induced by the compressive stress inducing material. Typically, the embedded semiconductor regions 25 are composed of compressive stress inducing materials increase the speed of hole charge carriers, and therefore provide performance enhancements, such as increased switching speed, in p-type semiconductor devices.

A number of different sources may be used for the epitaxial deposition of silicon-germanium for the stress inducing material. In some embodiments, the gas source for the deposition of epitaxial SiGe may include a mixture of silane ($SiH_4$), and germane ($GeH_4$) gas. The Ge content of the epitaxial grown SiGe may range from 5% to 60%, by atomic weight %. In another embodiment, the Ge content of the epitaxial grown SiGe may range from 10% to 40%.

The term "tensile stress inducing material" denotes a material layer having an intrinsic tensile stress, in which the intrinsic tensile stress produces a tensile stress in an adjacent material. In one embodiment, the tensile stress inducing material comprises silicon doped with carbon (Si:C) that is grown atop silicon (Si). Increasing the carbon content decreases the lattice dimension of the silicon doped with carbon (Si:C), and therefore increases the tensile stress that is induced by the tensile stress inducing material. Typically, the embedded semiconductor regions 25 are composed of tensile stress inducing materials increase the speed of electron charge carriers, and therefore provide performance enhancements, such as increased switching speed, in n-type semiconductor devices. In the embodiments, in which the stress inducing material is composed of epitaxially grown Si:C or carbon doped silicon, the carbon (C) content of the epitaxial grown Si:C may range from 0.3% to 5%, by atomic weight %. In another embodiment, the carbon (C) content of the epitaxial grown Si:C may range from 1% to 2%.

As indicated above, the outer edge E1 of the embedded semiconductor regions 25 may be separated from the trench isolation region 10 by a dimension W3 ranging from 5 nm to 50 nm. In another embodiment, the outer edge E1 of the embedded semiconductor regions 25 may be separated from the trench isolation region 10 by a dimension W3 ranging from 10 nm to 30 nm. By separating the embedded semiconductor regions 25 from the trench isolation region 10, the present disclosure substantially reduces or eliminates facet formation in the embedded semiconductor region 25.

Figure 3:
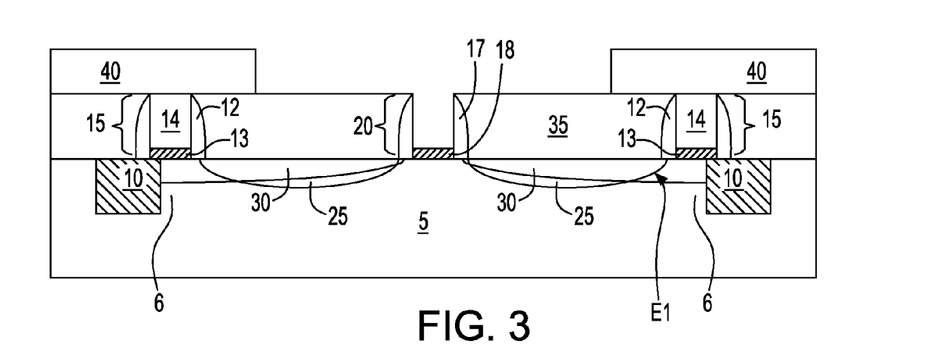
FIG. 3 is a side cross-sectional view of removing a device replacement gate structure of the plurality of gate structures to provide an opening to an exposed portion of the active region of the semiconductor substrate, while the interface replacement gate structures of the plurality of gate structures are protected by a first photoresist mask, in accordance with one embodiment of the present disclosure.

Referring to FIG. 3, source and drain regions 30 may be formed in the active region of the semiconductor substrate 5, and partially extend under the device replacement gate structure 20. Source and drain regions 30 are formed via ion implantation of a p-type or n-type dopant into the semiconductor substrate 5. As used herein, "p-type" refers to the addition of impurities to an intrinsic semiconductor that creates deficiencies of valence electrons. The p-type conductivity semiconductor devices are typically produced within silicon containing substrates by doping the source and drain region 30 adjacent to the first replacement gate structure 5a with elements from group III-A of the Periodic Table of Elements. In a silicon containing substrate, examples of p-type dopants, i.e., impurities, include but are not limited to boron, aluminum, gallium and indium. The term "n-type" refers to the addition of impurities that contributes free electrons to an intrinsic semiconductor. The n-type conductivity semiconductor devices are typically produced within silicon containing substrates by doping the source and drain regions 30 with elements from group V-A of the Periodic Table of Elements. In a silicon containing substrate, examples of n-type dopants, i.e., impurities, include but are not limited to, antimony, arsenic and phosphorous. In another embodiment, to provide the source and drain regions, the embedded semiconductor regions 25 may be in-situ doped. The term "in-situ doped" means that the dopant that provides the conductivity of the source and drain regions is introduced during the epitaxial growth process that forms the embedded semiconductor regions 25. The source and drain regions 30 may be activated by activation annealing at this stage of the process or at a later stage of the process. Activation anneal may be conducted at a temperature ranging from 850° C. to 1350° C.

Still referring to FIG. 3, a hardmask dielectric layer 35 is formed on the semiconductor substrate 5 having an upper surface that is coplanar with an upper surface of the replacement gate structures 15, 20. The hardmask dielectric layer 35 may be blanket deposited atop the entire semiconductor substrate 5 and planarized. The blanket dielectric may be selected from the group consisting of silicon-containing materials such as $SiO_2$, $Si_3N_4$, $SiO_xN_y$, SiC, SiCO, SiCOH, and SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon, α-C:H). Additional choices for the blanket dielectric includes any of the aforementioned materials in porous form, or in a form that changes during processing to or from being porous and/or permeable to being non-porous and/or non-permeable.

The hardmask dielectric layer 35 may be formed using a deposited process, such as chemical vapor deposition (CVD). Variations of CVD processes that are suitable for forming the hardmask dielectric layer 35 include, but are not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The hardmask dielectric layer 35 may also be deposited using evaporation, chemical solution deposition, spin on deposition, and physical vapor deposition (PVD) methods. Following deposition, the hardmask dielectric layer 35 may be planarized so that the upper surface of the hardmask dielectric layer 35 is coplanar with the upper surface of the replacement gate structures 15, 20. Planarization is a material removal process that employs at least mechanical forces, such as frictional media, to produce a planar surface. The hardmask dielectric layer 35 may be planarized using chemical mechanical planarization (CMP). Chemical mechanical planarization (CMP) is a material removal process using both chemical reactions and mechanical forces to remove material and planarize a surface.

A first photoresist mask 40 is formed over the interface replacement gate structure 15, while an upper surface of the device replacement gate structure 20 is exposed. A photoresist etch mask (not shown) can be produced by applying a photoresist layer to the surface of the hardmask dielectric layer 35, exposing the photoresist layer to a pattern of radiation, and then developing the pattern into the photoresist layer utilizing a resist developer.

FIG. 3 further depicts one embodiment of removing the sacrificial gate conductor structure 19 of the device replacement gate structure 20 to provide an opening to gate dielectric 18 of the device replacement gate structure 20. The sacrificial gate conductor structure 19 is typically removed using a selective etch process that removes the device replacement gate conductor 19 selective to the gate dielectric 18, the spacer 17, and the hardmask dielectric layer 35. The etch may be an isotropic etch or an anisotropic etch. The anisotropic etch may include reactive-ion etching (RIE). Other examples of anisotropic etching that can be used at this point of the present disclosure include ion beam etching, plasma etching or laser ablation. In comparison to anisotropic etching, isotropic etching is non-directional. One example of an isotropic etch is a wet chemical etch.

Figure 4:
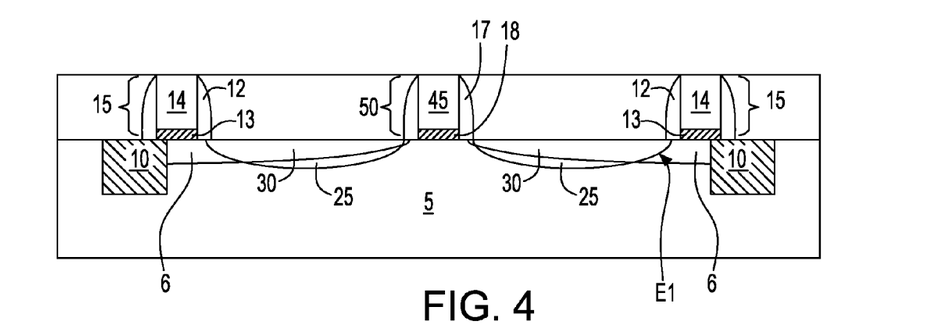
FIG. 4 is a side cross-sectional view depicting forming a functional gate structure, in accordance with one embodiment of the present disclosure.

FIG. 4 depicts one embodiment of forming a functional gate conductor 45 of the functioning gate structure 50 within the opening to the gate dielectric 18. The functional gate conductor 45 may be a conformally deposited layer that is present on the sidewalls of the openings, e.g., exposed sidewalls of the spacer 17, and on the remaining portion of the gate dielectric 18. In one embodiment, the functional gate conductor 45 is composed of at least one of TiAl, TanN, TiN, HfN, HfSi, TiAlN, Ru, Pt, Mo, Co and alloys and or combinations thereof. The functional gate conductor 45 can be deposited using chemical vapor deposition (CVD), atomic layer deposition (ALD), sputtering or plating. In one embodiment, the functional gate conductor 45 is composed of titanium aluminum (TiAl) and is deposited using sputtering. As used herein, "sputtering" means a method for depositing a film of metallic material, in which a target of the desired material, i.e., source, is bombarded with particles, e.g., ions, which knock atoms from the target, where the dislodged target material deposits on a deposition surface. Examples of sputtering apparatus that may be suitable for depositing the n-type work function metal layer include DC diode type systems, radio frequency (RF) sputtering, magnetron sputtering, and ionized metal plasma (IMP) sputtering.

In addition to physical vapor deposition (PVD) techniques, such as sputtering, the p-type work function metal layer may also be formed using chemical vapor deposition (CVD) and atomic layer deposition (ALD). Although, the functional gate conductor 45 has been described as being composed of a metal, the functional gate conductor 45 may also be composed of doped silicon, e.g., doped polysilicon.

The metal-containing layer or doped semiconductor material that provides the functional gate conductor 45 may be deposited to fill the opening to the gate dielectric 18. The functional gate conductor 45 may be planarized until an upper surface of the functional gate conductor 45 is coplanar with an upper surface of the hardmask dielectric layer 35, as depicted in FIG. 4. In one example, the planarization process is provided by chemical mechanical planarization (CMP). The functioning gate structure 50 that is provided by the functional gate conductor 45 and the gate dielectric 18 is the structure used to control output current, i.e., flow of carriers in the channel, of the semiconducting device, such as a field effect transistor, through electrical or magnetic fields.

The first photoresist mask 40 may be removed using selective etching, chemical mechanical polishing (CMP) or oxygen ashing.

Figure 5:
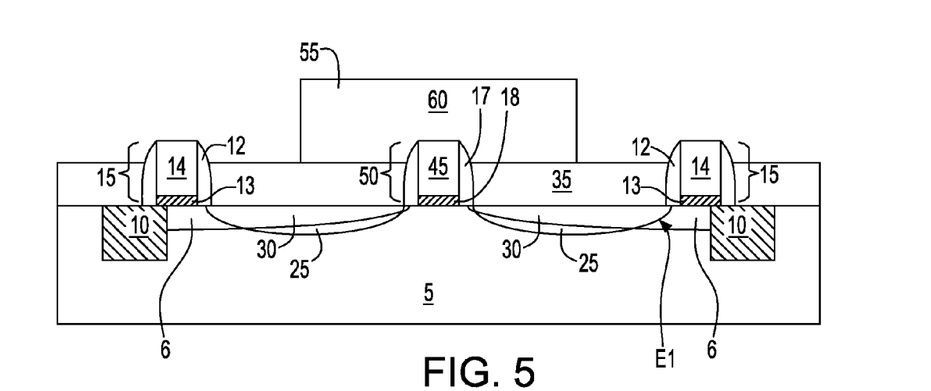
FIG. 5 is a side cross-sectional view depicting a second photoresist mask over the functional gate structure, in accordance with one embodiment of the present disclosure.

Referring to FIG. 5, the hardmask dielectric layer 35 is recessed to expose at least a portion of the sidewalls of the spacers 12, 17 of the interface replacement gate structure 15, and the device replacement gate structure 20. The upper surface of the hardmask dielectric layer 35 may be recessed using an etch that is selective to the interface replacement gate structure 15 and the spacers 17 and the functional gate conductor 45 of the functional gate structure 50. A second photoresist mask 55 may be formed over the functional gate structure 50, while the upper surface of the interface gate structures 15 are exposed. The second photoresist mask 55 is similar to the first photoresist mask 40 that is described above with reference to FIG. 2. Therefore, the description of the first photoresist mask 40 that is described above with reference to FIG. 2 is suitable for the second photoresist mask 55 that is depicted in FIG. 5.

Figure 6:
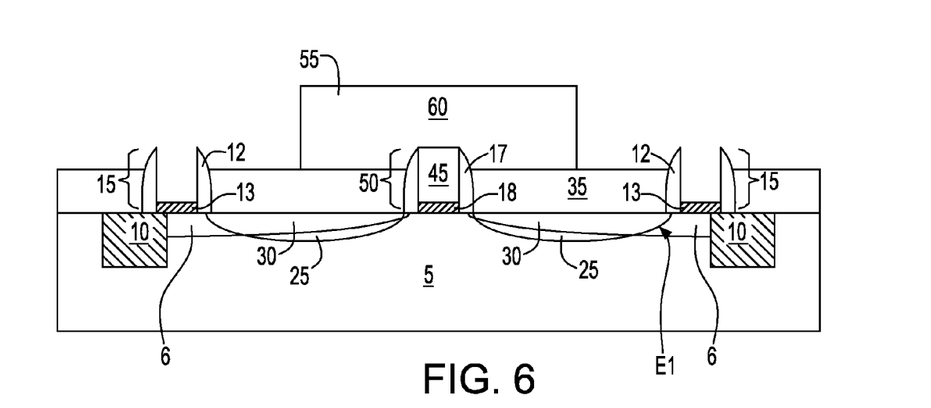
FIG. 6 is a side cross-sectional view depicting removing a sacrificial gate conductor structure of the interface replacement gate structures, in accordance with one embodiment of the present disclosure.
Figure 7:
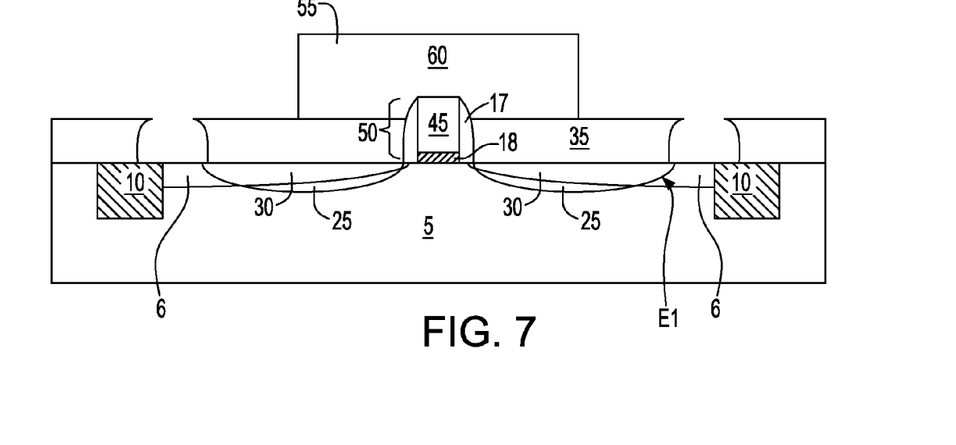
FIG. 7 is a side cross-sectional view depicting removing the spacers and gate dielectric of the interface replacement gate structures, in accordance with one embodiment of the present disclosure.

FIG. 6 depicts removing a sacrificial gate conductor structure 14 of the interface replacement gate structures 15. The sacrificial gate conductor structure 14 may be removed by an etch that is selective to the hardmask 35, the second photoresist mask 55, the spacer 12, and the gate dielectric 13. In some embodiments, the sacrificial gate conductor structure 14 is removed by an etch process that also removes the gate dielectric 13 and the spacer 12, wherein the etch is selective to the semiconductor substrate 5, the hardmask layer 35 and the second photoresist mask 55, as depicted in FIG. 7. In another embodiment, each of the sacrificial gate conductor structure 14, the gate dielectric 13, and the spacer 12 are removed independently using a selective etch process. In a following process sequence, the hardmask layer 35 and the second photoresist mask 55 may be removed.

Figure 8A:
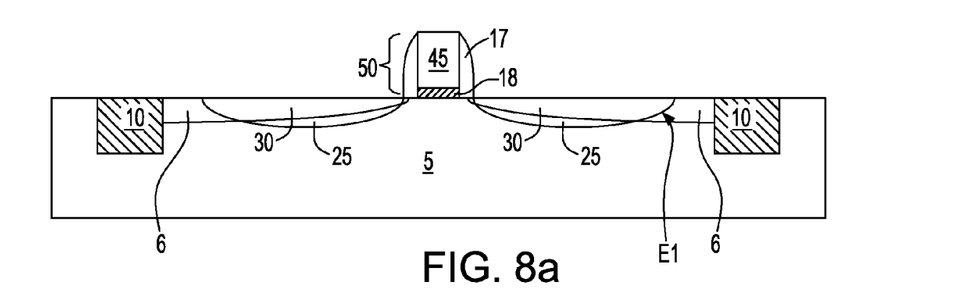
FIGS. 8a-8b are side cross-sectional views depicting a semiconductor device including a functional gate structure present on an active region of a semiconductor substrate, wherein the source and drains regions of the device are present in embedded semiconductor regions, in which a portion of the active region separates the embedded semiconductor regions from the trench isolation regions, in accordance with one embodiment of the present disclosure.
Figure 8B:
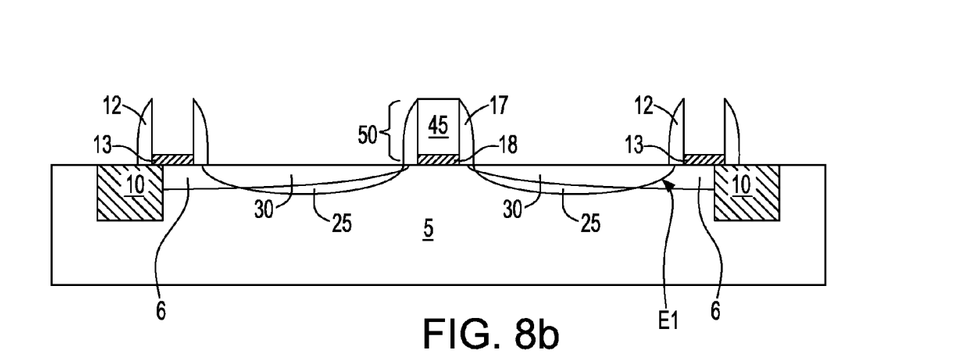

FIG. 8a depicts one embodiment of a semiconductor device 100 that may be formed using the method described above. In one embodiment, the semiconductor device 100 includes a semiconductor substrate 5 including an active region and at least one trench isolation region 10 at a perimeter of the active region, and a functional gate structure 50 present on a portion of the active region of the semiconductor substrate 5. Embedded semiconductor regions 25 are present in the active region of the semiconductor substrate 5 on opposing sides of the portion of the active region that the functional gate structure 50 is present on. A portion 6 of the active region of the semiconductor substrate 5 separates the outermost edge E1 of the embedded semiconductor regions 25 from the at least one trench isolation region 10. In one embodiment, a spacer 12 remaining from the interface replacement gate (also referred to as a "replacement gate spacer") is present over an interface between the portion of the active region of the semiconductor substrate 5 that separates the outermost edge E1 of the embedded semiconductor regions 25 from the at least one trench isolation region 10, as depicted in FIG. 8b. Still referring to FIG. 8b, the gate dielectric 13 of the interface replacement gate structure may also be present over the interface between the portion of the active region of the semiconductor substrate 5 and the trench isolation region 10. One of the gate dielectric 13 and the spacer 12 may be omitted from the structure depicted in FIG. 8b.

Figure 9:
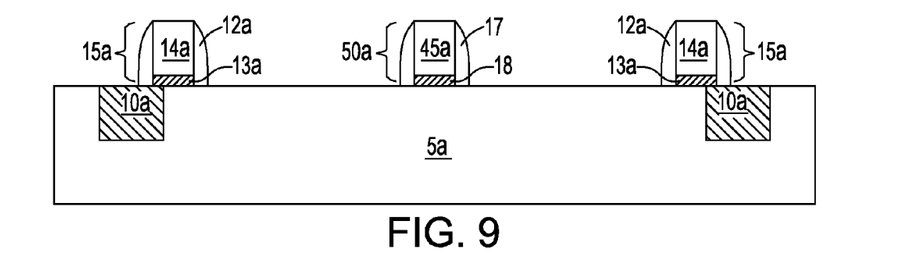
FIG. 9 is a side cross-sectional view depicting forming a functional gate structure on the active device region of a semiconductor substrate, and forming an interface gate first structure over an interface between the active region and at least one trench isolation region, in accordance with one embodiment of the present disclosure.

FIGS. 1-7 depict one embodiment of forming a semiconductor device, such as the semiconductor device 100 depicted in FIG. 8, using a replacement gate process for forming the functional gate structure 50. FIGS. 9-12 depict another embodiment of the present disclosure, that employs a gate first process to form the functional gate structure 50a of the semiconductor device. Referring to FIG. 9, the method may begin with providing a semiconductor substrate 5a including an active region and at least one trench isolation region 10a at a perimeter of the active region, forming at least one functional gate structure 50a on a portion of the active region that is separated from the at least one isolation region 10a, and forming an interface gate structure 15a on an interface between the active region of the semiconductor substrate 5a and the at least one trench isolation region 10a. The semiconductor substrate 5a, trench isolation region 10a and the interface gate structure 15a that are depicted in FIG. 9 are similar to the semiconductor substrate 5, trench isolation region 10, and interface gate structure 15 that are depicted in FIG. 1. Therefore, the description of the semiconductor substrate 5, trench isolation region 10, and interface gate structure 15 with reference to FIG. 1 is suitable for the semiconductor substrate 5a, trench isolation region 10a and the interface gate structure 15a that are depicted in FIG. 9.

The functional gate structure 50a that is depicted in FIG. 9 is composed of a functional gate conductor 45a over a gate dielectric 18a. The functional gate conductor 45a may be composed of a similar material as the functional gate conductor 45 that is described above with reference to FIG. 4. The gate dielectric 18a may be composed of a similar material as the gate dielectric 18 that is described above with reference to FIG. 1. The functional gate structure 50a may be formed using a gate first method. Specifically, the material layers for the functional gate conductor 45a and the gate dielectric 18a may first be deposited on the semiconductor substrate 10a to provide a material stack. Thereafter, the material stack may be patterned and etched to form a gate stack. Spacers 17a may then be formed adjacent to the gate stack using a method similar to forming the spacer 17 depicted in FIG. 1.

Figure 10:
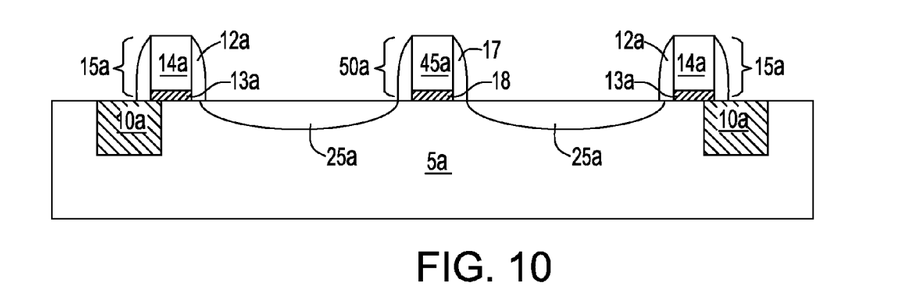
FIG. 10 is a side cross-sectional view depicting forming embedded semiconductor regions in the active region of the semiconductor substrate depicted in FIG. 9, in accordance with one embodiment of the present disclosure.

FIG. 10 depicts forming embedded semiconductor regions 25a in the active region of the semiconductor substrate 5a between the portion of the active region that the functional gate structure 50a is present on and the portion of the active region at the interface with the at least one trench isolation region 10a that the interface replacement gate structure 15a is present on. The embedded semiconductor regions 25a depicted in FIG. 10 are similar to the embedded semiconductor regions 25a described above with reference to FIG. 2. Therefore, the description of the embedded semiconductor regions 25a that are depicted in FIG. 2 are suitable for describing the embedded semiconductor regions 25a that are depicted in FIG. 10.

Figure 11:
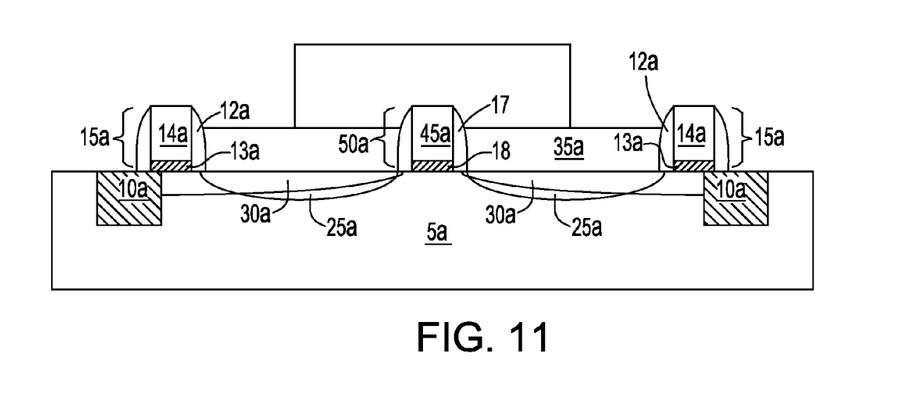
FIG. 11 is a side cross-sectional view depicted forming a photoresist mask over the functional gate structure.

FIG. 11 depicts forming source regions and drain regions 30a on opposing sides of the portion of the semiconductor substrate 10a that the functional gate structure 50a is formed on. The source regions and drain regions 30a that are depicted in FIG. 11 are similar to the source and drain regions 30 that are described above with reference to FIG. 3. FIG. 11 also depicts forming a hard mask layer 35a over the interface replacement gate structures 15a and the functional gate structure 50a, recessing the hard mask layer 35a, and forming a photoresist mask 60 over the functional gate structure 50a. The hard mask layer 35a depicted in FIG. 11 is similar to the hard mask layer 35 that is depicted in FIGS. 4-6. Therefore, the description of the hard mask layer 35 with reference to FIGS. 4-6 is suitable for the hard mask layer 35a depicted in FIG. 11. The photoresist mask 60 depicted in FIG. 11 is similar to the second photoresist mask 55 that is depicted in FIG. 5.

Figure 12:
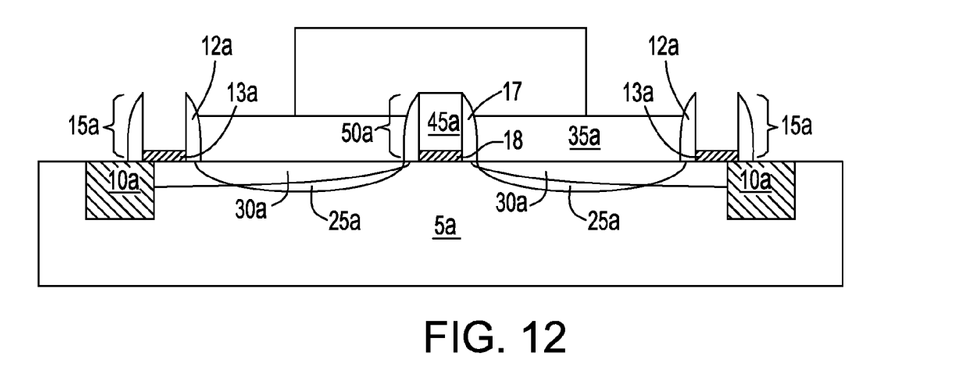
FIG. 12 is a side cross-sectional view depicting removing at least a portion of the interface gate structure, in accordance with one embodiment of the present disclosure.

FIG. 12 depicts removing at least a portion of the interface replacement gate structure 15a. In some embodiments, the sacrificial gate conductor structure 14a of the interface replacement gate structure 15a is removed by an etch process that also removes the gate dielectric 13a and the replacement gate spacers 12a, wherein the etch is selective to the semiconductor substrate 5a, the hardmask layer 35a and the photoresist mask 60. In another embodiment, each of the sacrificial gate conductor structure 14a, the gate dielectric 13a, and the spacers 12a are removed independently using a selective etch process. In some examples at least one of the gate dielectric 13a and the gate spacers 12a remains in the final structure.

The method depicted in FIGS. 9-12 may provide the semiconductor device 100 that is depicted in FIGS. 8a and 8b. The gate first process depicted in FIGS. 9-12 eliminates the requirement of a photolithography, etch and deposition sequence to remove the replace the sacrificial gate structure 14, 14a with a functional gate structure, as required by a replacement gate process, such as the process sequence depicted in FIGS. 1-7.

In some embodiments, the methods and structures disclosed herein reduce or substantially eliminate the formation of faceting within an embedded semiconductor region 25, 25a such as embedded silicon germanium, by obstructing the contact of the embedded semiconductor region with a trench isolation region 10, 10a. Further, in some embodiments, by removing the sacrificial gate conductor structure 14, 14a from the interface replacement gate structure 15, 15a, the present disclosure reduces parasitic capacitance.

While the present disclosure has been particularly shown and described with respect to preferred embodiments thereof, it will be understood by those skilled in the art that the foregoing and other changes in forms and details may be made without departing from the scope and spirit of the present disclosure. It is therefore intended that the present disclosure not be limited to the exact forms and details described and illustrated, but fall within the scope of the appended claims.

What is claimed is:

1. A semiconductor device comprising:
   a semiconductor substrate including an active region and at least one trench isolation region at a perimeter of the active region;
   a functional gate structure present on a portion of the active region of the semiconductor substrate;
   embedded semiconductor regions present in the active region of the semiconductor substrate on opposing sides of the portion of the active region that the functional gate structure is present on, wherein another portion of the active region of the semiconductor substrate laterally separates an outermost edge of each of the embedded semiconductor regions from the at least one isolation region; and
   a hardmask dielectric layer present over an upper surface of the semiconductor substrate and laterally surrounding a lower portion of the functional gate structure and a pair of cavities, wherein each cavity exposes the another portion of the active region and a portion of the at least one trench isolation region.

2. The semiconductor device of claim 1, wherein the semiconductor substrate comprises Si, SiGe, SiGeC, SiC, polysilicon, germanium, gallium arsenide, gallium nitride, cadmium telluride, or zinc sellenide.

3. The semiconductor device of claim 2, wherein the active region of the semiconductor substrate is doped with an n-type or a p-type dopant.

4. The semiconductor device of claim 1, wherein the embedded semiconductor regions comprise an epitaxially grown semiconductor material.

5. The semiconductor device of claim 4, wherein the embedded semiconductor regions comprise a stress inducing material.

6. The semiconductor device of claim 5, wherein the embedded semiconductor regions comprise silicon germanium, silicon carbide or carbon doped silicon.

7. The semiconductor device of claim 1, further comprising source and drain regions located within the active region, wherein the source and drain regions extend from the functional gate structure to the at least one trench isolation region and are doped to a p-type or an n-type conductivity.

8. The semiconductor device of claim 7, wherein each of the source and drain regions overlaps with a portion of one of the embedded semiconductor regions.

9. The semiconductor device of claim 1, wherein the another portion of the active region of the semiconductor substrate that laterally separates the outermost edge of each of the embedded semiconductor regions from the at least one isolation region has a width ranging from 5 nm to 50 nm.

10. The semiconductor device of claim 1, further comprising a replacement gate spacer present on a sidewall of the cavities, the replacement gate spacers is present over an interface between each of embedded semiconductor region and a corresponding another portion of the active region of the semiconductor substrate that laterally separates the outermost edge of each of the embedded semiconductor regions from the at least one isolation region.

11. The semiconductor device of claim 10, further comprising a gate dielectric contacting a bottom surface of each of the cavities and laterally surrounded by the replacement gate spacer.

12. The semiconductor device of claim 1, wherein the functional gate structure comprises a gate stack comprising a gate dielectric and a functional gate conductor present over the gate dielectric and a spacer present on each sidewall of the gate stack.

13. The semiconductor device of claim 1, wherein the hardmask dielectric layer has an upper surface located below a topmost of the functional gate structure.

14. The semiconductor device of claim 1, wherein a top surface of each of the embedded semiconductor regions is coplanar with the upper surface of the semiconductor substrate.

* * * * *